(12) United States Patent
Asai et al.

(10) Patent No.: US 7,156,669 B2
(45) Date of Patent: Jan. 2, 2007

(54) ANISOTROPIC CONDUCTIVE FILM

(75) Inventors: Fumiteru Asai, Ibaraki (JP); Masato Noro, Ibaraki (JP)

(73) Assignee: Nitto Denko Corporation, Ibaraki (JP)

( * ) Notice: Subject to any disclaimer, the term of this patent is extended or adjusted under 35 U.S.C. 154(b) by 9 days.

(21) Appl. No.: 10/936,946

(22) Filed: Sep. 9, 2004

(65) Prior Publication Data

US 2005/0077542 A1 Apr. 14, 2005

(30) Foreign Application Priority Data

Sep. 9, 2003 (JP) ............................ 2003-317453
Sep. 18, 2003 (JP) ............................ 2003-326810

(51) Int. Cl.
*H01R 9/09* (2006.01)
(52) U.S. Cl. .................... 439/91; 439/111; 439/591
(58) Field of Classification Search ............. 439/91, 439/591, 111
See application file for complete search history.

(56) References Cited

U.S. PATENT DOCUMENTS

| | | | | | |
|---|---|---|---|---|---|
| 3,541,222 | A | * | 11/1970 | Kitaguchi et al. | 174/260 |
| 3,620,873 | A | * | 11/1971 | Ehrreich et al. | 156/250 |
| 3,971,610 | A | * | 7/1976 | Buchoff et al. | 439/75 |
| 4,008,300 | A | * | 2/1977 | Ponn | 264/104 |
| 4,209,481 | A | * | 6/1980 | Kashiro et al. | 264/437 |
| 4,249,302 | A | * | 2/1981 | Crepeau | 29/830 |
| 4,402,562 | A | * | 9/1983 | Sado | 439/91 |
| 4,820,376 | A | * | 4/1989 | Lambert et al. | 216/11 |
| 4,988,306 | A | * | 1/1991 | Hopfer et al. | 439/66 |
| 5,071,359 | A | * | 12/1991 | Arnio et al. | 439/91 |
| 5,101,553 | A | * | 4/1992 | Carey et al. | 29/882 |
| 5,259,110 | A | * | 11/1993 | Bross et al. | 29/830 |
| 5,438,223 | A | * | 8/1995 | Higashi et al. | 257/774 |
| 5,447,264 | A | * | 9/1995 | Koopman et al. | 228/56.3 |
| 5,509,203 | A | * | 4/1996 | Yamashita | 29/879 |
| 5,515,604 | A | * | 5/1996 | Horine et al. | 29/830 |
| 5,618,189 | A | * | 4/1997 | Jin et al. | 439/91 |
| 5,624,268 | A | * | 4/1997 | Maeda et al. | 439/66 |
| 5,751,068 | A | * | 5/1998 | McMahon et al. | 257/774 |
| 6,059,579 | A | * | 5/2000 | Kresge et al. | 439/66 |
| 6,093,476 | A | * | 7/2000 | Horiuchi et al. | 428/209 |
| 6,108,903 | A | * | 8/2000 | Nakatani et al. | 29/852 |
| 6,245,175 | B1 | | 6/2001 | Hotta et al. | |
| 6,465,084 | B1 | * | 10/2002 | Curcio et al. | 428/209 |
| 6,566,608 | B1 | * | 5/2003 | Yamaguchi et al. | 174/117 F |

FOREIGN PATENT DOCUMENTS

JP 2002-042921 A 2/2002

\* cited by examiner

*Primary Examiner*—Cathy F. Lam
(74) *Attorney, Agent, or Firm*—Leydig, Voit & Mayer, Ltd.

(57) ABSTRACT

The present invention provides an anisotropic conductive film for testing an electronic component, which comprises a film substrate comprising an insulating resin and plural conductive paths insulated from each other and penetrating the film substrate in the thickness direction, preferably, an anisotropic conductive film wherein the plural conductive paths are disposed in a houndstooth check pattern and the distance between conductive paths between adjacent rows of conductive paths is smaller than the distance between conductive paths within a row of conductive paths. In another preferable embodiment, the insulating resin comprises a naphthalene skeleton epoxy resin crosslinked with a phenol resin and an acrylic rubber, and both ends of the plural conductive paths are exposed on both the front and the back surfaces of the film substrate.

9 Claims, 7 Drawing Sheets

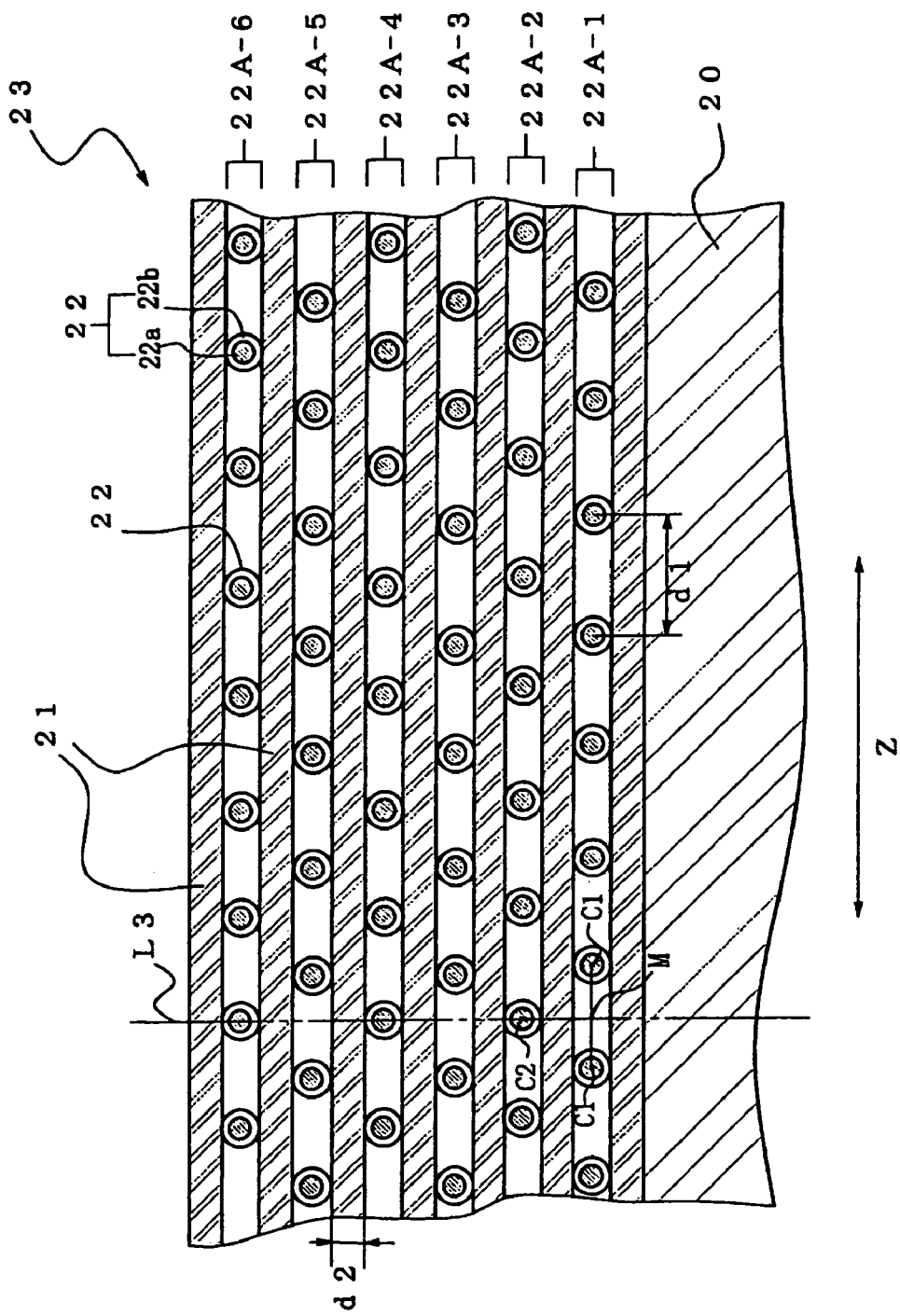

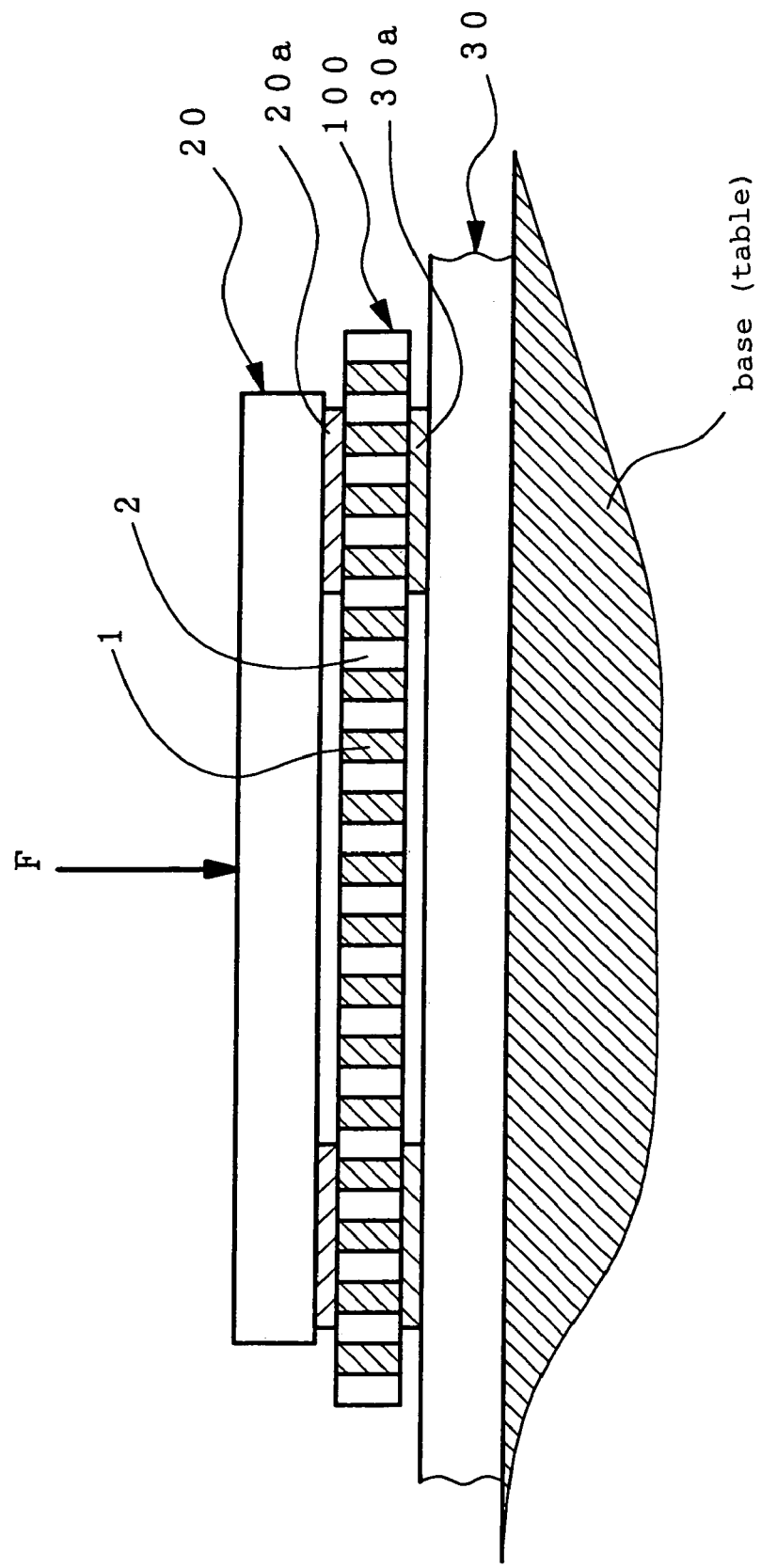

ANISOTROPIC CONDUCTIVE FILM

FIELD OF THE INVENTION

The present invention relates to an anisotropic conductive film, a production method thereof and a test method of an electronic component using the same.

BACKGROUND OF THE INVENTION

For an electrical connection between an electronic component such as a semiconductor element (IC chip) and the like and a circuit board, an anisotropic conductive connector has been widely used in recent years. As an anisotropic conductive connector, one prepared by dispersing conductive fine particles in an insulating film has been conventionally known. This anisotropic conductive connector is associated with problems of structurally difficult connection with a connection target having a fine pitch and the need for forming a terminal of the connection target, such as electrode of semiconductor element and the like in a protrusion (bump). Thus, as an anisotropic conductive connector capable of resolving such problems, namely, an anisotropic conductive connector capable of dealing with finely pitched and bumpless target, the Applicant of this invention has proposed an anisotropic conductive connector (film) comprising, in the substrate of an insulating film, plural conductive paths penetrating in the thickness direction of the film substrate while being insulated from each other, in international publication WO98/07216 (U.S. Pat. No. 6,245,175).

Generally, anisotropic conductive connectors have been employed for the following two uses. One is use as, what is called, a mounting connector, wherein an anisotropic conductive connector is disposed between an electronic component such as a semiconductor element and the like and a circuit board, which, upon heating and pressing, electrically and mechanically connects the electronic component and the circuit board. The other is use as, what is called, a test connector, wherein, in functional tests of electronic components such as semiconductor element and the like, an anisotropic conductive connector is inserted between an electronic component and a circuit board, which, upon press adhesion to the both, achieves a functionally testable conduction between the electronic component and the circuit board.

The use of an anisotropic conductive connector as a test connector is necessary because a functional test of an electronic component after mounting the electronic component on a circuit board only to prove that the electronic component is defective results in disposal of a good circuit board together with the component, thereby lowering the production efficiency of the circuit board and increasing an economical loss.

In a conduction test of a semiconductor element, an electronic component and a circuit board, a probe pin has been used conventionally, but a probe exclusive for each test subject component needs to be made because the position of an electrode differs for each test subject component. In recent years, moreover, the size of an electronic component and an electrode of a circuit board as well as distance between electrodes have been reduced, which makes production of a probe pin problematically difficult or costly. Thus, the use of an anisotropic conductive film has been proposed for conduction test of an electronic component and the like.

When an anisotropic conductive film is used as a test connector, a load for electric conduction between an electronic component and a circuit board is preferably as small as possible, in view of improved efficiency of test operation and prevention of terminal damage and deformation of an electronic component and a circuit board. To achieve this, an anisotropic conductive film is required to have flexibility permitting followability to the surface shape of an electronic component and a circuit board. On the other hand, when an anisotropic conductive film is used as a mounting connector, it is required to achieve not only easy contact of a conductive path of the connector to the terminal of a connection target such as an electronic component, a circuit board and the like, but also sufficient adhesion of the connector to a connection target.

As mentioned above, in order to enhance flexibility and adhesiveness of an anisotropic conductive film, it is preferable to increase the proportion of a resin in an anisotropic conductive film. However, the anisotropic conductive film proposed in WO98/07216 is produced by a method comprising winding an insulated conductive wire (metal wire coated with insulating resin layer) multiple times around a core, bonding coating layers to prevent separation from each other to give a winding block, and cutting this block in a desired thickness along the plane forming an angle with each insulated conductive wire (metal wire). Therefore, increase of the proportion of a resin in an anisotropic conductive film has been difficult. In other words, the thickness of an insulating resin layer of an insulated conductive wire cannot be increased beyond a certain level, and therefore, the proportion of a resin in an anisotropic conductive film cannot be increased sufficiently. Thus, the present Applicant has proposed, as a method for producing an anisotropic conductive film having a sufficiently increased proportion of a resin, a method comprising cutting out a film from a block having a multilayer structure achieved by alternately winding a layer of wound wire comprising an insulated conductive wire and an insulating resin film around a core (JP-A-2002-42921).

SUMMARY OF THE INVENTION

However, since the anisotropic conductive film disclosed in JP-A-2002-42921 aims only at increasing the proportion of a resin in a film, the distance between adjacent conductive paths (proportion of insulated area) in an anisotropic conductive film becomes too large, which makes sufficient application thereof to a narrow pitch terminal of a connection target (electronic component, circuit board) unattainable. In addition, some of the electronic components have terminals disposed at a narrow pitch, and in some cases, the surface of a terminal disposed at a narrow pitch is far back from the surface of the body of the component. There is a demand for an anisotropic conductive film that permits a functional test of an electronic component having such a surface structure only by pressing against the component at a low load.

In connection with the above, the present inventors have found that, when an anisotropic conductive film is to be used, problems occur such as a contact failure between electrodes, "staining of metal electrode" and the like in a conduction test of an electronic component at a high temperature. Even when a simple conduction test using an electrically conductive rubber is conducted, a problem of failure to mount an electronic component and a circuit board occurs.

In view of the above-mentioned situation, the present invention mainly aims at providing an anisotropic conductive film affording a fine contact between a terminal of a connection target and a conductive path by simply applying a relatively low load to a connection target having a narrow-pitched terminal, particularly a connection target having a narrow pitch and a terminal disposed far back from the surface of the component and a production method thereof. In another aspect, the present invention mainly aims at providing an anisotropic conductive film for an electronic component test, which is unlikely to stain an electrode of a test subject electronic component and the surface of a circuit pattern of a circuit board, in a wide temperature range of from 20° C. to 150° C. The present invention also aims at providing a highly reliable test method of an electronic component using an anisotropic conductive film.

The present inventors have conducted intensive studies in an attempt to solve the aforementioned problems and found that an anisotropic conductive film showing relatively high flexibility even in the presence of highly densely disposed conductive paths can be obtained by arranging conductive paths in a houndstooth check pattern, and decreasing the distance between conductive paths between rows of conductive paths rather than the distance between conductive paths within a row of conductive paths. The present inventors have further found that, in order to obtain an anisotropic conductive film capable of achieving a fine contact between a terminal of a connection target and a conductive path by only applying a relatively low load to a connection target (an electronic component etc.) having a terminal disposed far back from the surface of the component, a conductive path arranged as mentioned above should be protruded from the principal plane of a film substrate, and preferably inclined such that a centerline thereof forms an angle of 5–45° with the vertical line of the principal plane of the film substrate. The present inventors have also found that the pollution of a metal electrode is caused by adhesion of a low molecular weight component generated from an anisotropic conductive film and a silicone component from an electrically conductive rubber (made of silicone) to the above-mentioned metal electrode. Based on these findings, the present inventors have further conducted intensive studies and completed the present invention directed to the following.

That is, the present invention relates to (1) an anisotropic conductive film for testing an electronic component, which comprises a film substrate comprising an insulating resin and plural conductive paths insulated from each other and penetrating the film substrate in the thickness direction, (2) the anisotropic conductive film of the above-mentioned (1), wherein the plural conductive paths are disposed in a houndstooth check pattern and the distance between conductive paths between adjacent rows of conductive paths is smaller than the distance between conductive paths within a row of conductive paths, (3) the anisotropic conductive film of the above-mentioned (2) wherein the distance between conductive paths between adjacent rows of conductive paths is smaller than the distance between conductive paths within a row of conductive paths both in one direction where plural rows of conductive paths in the principal plane of the film are arranged in parallel to each other, and the other direction perpendicular to said direction, (4) the anisotropic conductive film of the above-mentioned (2) or (3), wherein the conductive path has an outer diameter of 10–60 μm, the distance between conductive paths within a row of conductive paths is 30–200 μm, and the distance between conductive paths between adjacent rows of conductive paths is not more than 4/5 of the distance between conductive paths within a row of conductive paths, (5) the anisotropic conductive film of any of the above-mentioned (2) to (4), wherein the centerline of the plural conductive paths is inclined to form an angle of 5–45° with the vertical line of the principal plane of the film substrate, (6) the anisotropic conductive film of any of the above-mentioned (2) to (5), wherein at least one end of the conductive path protrudes from the principal plane of a film substrate, (7) the anisotropic conductive film of the above-mentioned (6), wherein both ends of the conductive path protrude from the principal planes of the film substrate, (8) the anisotropic conductive film of the above-mentioned (1), wherein the insulating resin comprises a naphthalene skeleton epoxy resin crosslinked with a phenol resin and an acrylic rubber, and both ends of the plural conductive paths are exposed on both the front and the back surfaces of the film substrate, (9) the anisotropic conductive film of the above-mentioned (8), wherein the film as a whole has a modulus of elasticity of 1 MPa–100 MPa at 20° C.–150° C., and the film has a thickness of 30 μm–1000 μm,

(10) the anisotropic conductive film of the above-mentioned (8) or (9), wherein both ends of the conductive paths protrude from the front and the back surfaces of the film substrate, a part of the conductive path, which penetrates the film substrate, is a conductive metal wire having a diameter of 10 μm–60 μm, the protrusion of the conductive path from the film substrate is made of the above-mentioned conductive metal wire itself extending from the film substrate, or a metal protrusion formed by plating the end of the above conductive metal wire,

(11) a production method of the anisotropic conductive film of the above-mentioned (1), which comprises the following steps:

Step 1: one sheet of an insulating resin film is wound roll-like around a core, an insulation wire comprising a conductive wire and a coating layer made of an insulating resin, which is formed on the outer periphery of the conductive wire, is wound around the outer periphery of the roll-like insulating resin film at a constant pitch like a coil, thereby to form a layer of wound wire, and this process is repeated to give a multilayer structure wherein the insulating resin film and the layer of wound wire of are alternately laminated, Step 2: the multilayer structure is heated and pressed to melt at least the insulating resin film in the multilayer structure to give a block of the multilayer structure, and, Step 3: the blocked multilayer structure is cut in a given film thickness along a plane forming an angle with a conductive wire therein as a section, wherein the insulating resin film used in Step 1 has a thickness of not more than 0.8 times the distance (pitch) between the centerlines of the adjacent insulation wires in the layer of wound wire to be formed, and wherein in Step 1, the winding position of the insulation wire is moved to the longitudinal direction of the core during formation of odd-numbered layers of wound wire and even-numbered layers of wound wire as counted from the core side, such that a middle point between the centerlines of the adjacent insulation wires in the odd-numbered layers of wound wire and the centerline of the insulation wires in the even-numbered layers of wound wire, both as counted from the core side, are aligned on the same virtual straight line,

(12) the production method of the above-mentioned (11), wherein, in Step 2, the multilayer structure obtained in Step 1 is disposed in a space that can be decompressed or vacuumized, and the multilayer structure is heated and pressed to give a block after decompressing or vacuumizing the aforementioned space,

(13) the production method of the above-mentioned (11) or (12), wherein the block of multilayer structure obtained in Step 2 is cut into plural blocks, the plural blocks are integrally connected to give a block having an enlarged section of the insulation wire, and Step 3 is applied to the block having a greater width,

(14) a method of testing an electronic component, which comprises disposing the anisotropic conductive film of any of the above-mentioned (8)–(10) between an electronic component comprising at least one electrode and a circuit board, such that an electrode of the above-mentioned electronic component and a conductive path of the anisotropic conductive film are in contact with each other, and the electronic component is electrically conducted while applying a contact load of 50 g/mm$^2$–5000 g/mm$^2$ per one electrode of the electronic component in the direction to press the anisotropic conductive film and the electronic component, and

(15) the test method of the above-mentioned (14), wherein application of the above-mentioned load compresses the anisotropic conductive film and the thickness of the film decreases by 5 µm–150 µm.

BRIEF DESCRIPTION OF THE DRAWINGS

FIG. 6 schematically shows a cross section of the multilayer structure of FIG. 5 along the longitudinal direction of the core.

FIG. 7 schematically shows the test method of the present invention, wherein the size of each part is enlarged out of proportion for explanation.

FIG. 8 is a schematic showing of the anisotropic conductive film of the present invention, wherein

The symbols of respective Figures mean as follows. 1 conductive path, 2 film substrate made of insulating resin, 10A-1, 10A-2, 10A-3, 10A-4 row of conductive paths, D1 distance between conductive paths within a row of conductive paths, D2 distance between conductive paths between adjacent rows of conductive paths, 20 electronic component, 30 circuit board, F contact load, 100 anisotropic conductive film.

DETAILED DESCRIPTION OF THE INVENTION

The anisotropic conductive film of the present invention comprises a film substrate comprising an insulating resin and plural conductive paths insulated from each other and penetrating the film substrate in the thickness direction.

<First Embodiment>

Figure 1A:
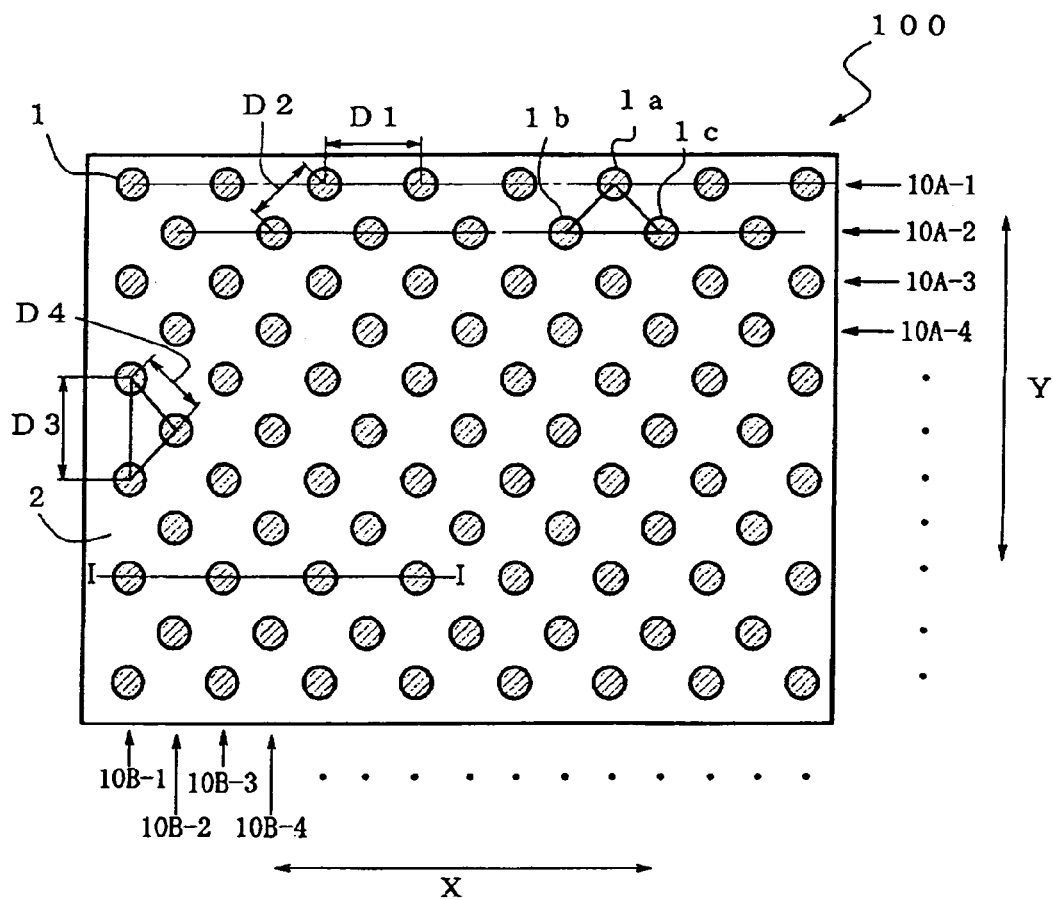
FIG. 1 includes a plane view (FIG. 1(a)) and a sectional view (FIG. 1(b)) schematically showing a first embodiment of an anisotropic conductive film of the present invention.
Figure 1B:
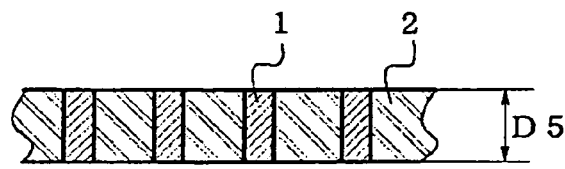

FIG. 1 schematically shows a first embodiment of the anisotropic conductive film of the present invention, wherein FIG. 1(a) is a plane view, and FIG. 1(b) is a sectional view of FIG. 1(a) along line I—I.

As used herein, the "houndstooth check" means the same as the "houndstooth check" used in various uses for electric or electronic connectors and the like to mean arrangement pattern of terminals and pins. For example, in FIG. 1, conductive paths 1 form rows of conductive paths (10A-1, 10A-2, 10A-3, 10A-4, . . . ) arranged in parallel to each other at a given pitch in one direction (e.g., direction Y in FIG. 1) of the principal plane of the film, and the position of respective conductive paths 1 constituting the odd-numbered rows of conductive paths (10A-1, 10A-3, . . . ) is out of alignment by about ½ pitch toward the aligning direction (direction X in FIG. 1) of the conductive path 1 from the position of respective conductive paths 1 constituting the even-numbered rows of conductive paths (10A-2, 10A-4, . . . ), as counted from the outermost end of the film.

By the "distance between conductive paths within a row of conductive paths" is meant, when conductive paths are aligned at a given pitch to constitute rows of conductive paths, the distance between the centerlines of adjacent conductive paths in the rows of conductive paths, which is shown by, for example, D1 and D3 in FIG. 1. By the "distance between conductive paths between adjacent rows of conductive paths" is meant the distance between any one conductive path in any row of conductive paths and a conductive path in a row of conductive paths adjacent to the aforementioned row of conductive paths, which is the nearest to the aforementioned conductive path, which is shown by, for example, D2, D4 in FIG. 1.

As used herein, by the "principal plane of a film (also referred to as a "film substrate")" is meant an end surface in the thickness direction of a film.

As shown in FIG. 1, in the basic structure of this embodiment of an anisotropic conductive film 100, a film substrate 2 made from an insulating resin comprises plural conductive paths 1 insulated from each other and penetrating the film substrate 2 in the thickness direction.

In the anisotropic conductive film of the first embodiment, plural conductive paths 1 are disposed to form a houndtooth check pattern and the distance between conductive paths (D2) between adjacent rows of conductive paths is smaller than the distance between conductive paths (pitch) (D1) within a row of conductive paths (10A-1, 10A-2, 10A-3, 10A-4 . . . ).

The smaller distance between conductive paths between adjacent rows of conductive paths than the distance between conductive paths within a row of conductive paths can be rephrased as follows.

When any one conductive path (e.g., a conductive path 1a) within any one row of conductive paths (e.g., a row of conductive paths 10A-1) and two conductive paths (e.g., conductive paths 1b, 1c) in the row of conductive paths (e.g., a row of conductive paths 10A-2) adjacent to the aforementioned row of conductive paths are connected, an isosceles triangle having an apex angle greater than 60° is obtained.

The above-mentioned particular positional relationship between conductive paths in the adjacent rows of conductive paths is preferably realized not only between plural rows of conductive paths disposed in parallel to each other in one direction (first direction) of the principal plane in a film (e.g., plural rows of conductive paths 10A-1, 10A-2, 10A-3, 10A-4 . . . arranged in parallel to direction Y in FIG. 1), but also in plural rows of conductive paths disposed in parallel to each other in the direction perpendicular to the first direction (second direction) in the principal plane of the film (e.g., plural rows of conductive paths 10B-1, 10B-2, 10B-3, 10B-4 . . . aligned in direction X in FIG. 1).

When conductive paths have the above-mentioned particular arrangement, a flexible anisotropic conductive film having conductive paths at a relatively high density can be obtained. A conductive path of such anisotropic conductive film certainly comes into contact with a narrow pitched terminal disposed on a connection target (electronic component, circuit board) by merely applying a load of a relatively low pressure. Therefore, the anisotropic conductive film of this embodiment can be used as a test connector. Since such anisotropic conductive film certainly adheres to an electronic component and a circuit board, it can be used as a mounting connector capable of mounting an electronic component having a narrow pitched terminal on a circuit board in an electrically and mechanically fine manner.

The outer diameter (thickness) of the conductive path 1 is preferably not more than 60 μm, more preferably not more than 30 μm. In addition, the distance between conductive paths within a row of conductive paths (distance between the centerlines of conductive paths) as shown by D1 and D3 in FIG. 1(a) is preferably not more than 200 μm, more preferably not more than 100 μm.

Due to such preferable outer diameter (thickness) of the conductive path and preferable distance between conductive paths within a row of conductive paths, terminals of a connection target having terminals disposed at a narrow pitch of not more than 200 μm, or not more than 100 μm, and the above-mentioned conductive paths 1 can be certainly contacted.

When the distance between conductive paths within a row of conductive paths is too small, an anisotropic conductive film becomes rigid, and the film cannot be deformed easily even with pressing. Therefore, the distance between conductive paths within a row of conductive paths is preferably not less than 30 μm. When the outer diameter (thickness) of the conductive path 1 is too small, the conductive path 1 receives a great damage along with increased number of use, and durability of an anisotropic conductive film 100 is degraded. Thus, the outer diameter (thickness) of the conductive path 1 is preferably not less than 10 μm.

To ensure connection between narrow pitched terminals of an electronic component and the like and conductive paths of an anisotropic conductive film with a low pressure load, it is important that the distance between conductive paths between adjacent rows of conductive paths be smaller than the distance between conductive paths within a row of conductive paths, as mentioned above. This means that D2 is smaller than D1 and D4 is smaller than D3 in FIG. 1(a). To ensure the aforementioned effect, the distance between conductive paths between adjacent rows of conductive paths (D2 and D4) is preferably not more than ⅘, more preferably not more than 7/10, of the distance between conductive paths within a row of conductive paths (D1, D3). However, when the distance between conductive paths between adjacent rows of conductive paths is too small, an anisotropic conductive film may become inflexible. Thus, the distance between conductive paths between adjacent rows of conductive paths (D2 and D4) is preferably not less than ½ of the distance between conductive paths within a row of conductive paths (D1, D3).

With regard to the above-mentioned plural rows of conductive paths (e.g., rows of conductive paths 10A-1, 10A-2, 10A-3, 10A-4 . . . in FIG. 1) arranged in parallel to each other in the first direction and plural rows of conductive paths (e.g., plural rows of conductive paths 10B-1, 10B-2, 10B-3, 10B-4 . . . arranged in parallel to the direction X in FIG. 1) arranged in parallel to each other in the above-mentioned second direction, the distance between conductive paths within a row of conductive paths D1 and D3, D1=D3 or D1≠D3. With regard to the distance between conductive paths between adjacent rows of conductive paths D2 and D4, moreover, D2=D4 or D2≠D4.

The thickness of an anisotropic conductive film is appropriately determined according to the use thereof. When it is used as a test connector, particularly from the aspects of warp of a test subject component, followability to irregularities of the terminal and the like, the thickness of an anisotropic conductive film is preferably about 30–1000 μm, particularly preferably about 50–500 μm. When an anisotropic conductive film is used as a mounting connector, the thickness thereof is preferably about 10–100 μm, particularly preferably about 30–80 μm, in view of adhesiveness and connection reliability. As used herein, the thickness of an anisotropic conductive film means a thickness of a film substrate 2 (D5 in FIG. 1(b)).

As materials to form a conductive path 1, known electrically conductive materials can be mentioned. From the aspect of electrical conductivity, metal materials such as copper, gold, aluminum, nickel and the like are preferable, and copper and gold are more preferable. In addition, the sectional shape of the conductive path 1 may be circular, polygonal or other shape and is not particularly limited. From the aspect of connection reliability with a terminal of a connection target, a circle is preferable. The aforementioned outer diameter (thickness) of the conductive path is a diameter of the section when the sectional shape of a conductive path is a circle, and when the sectional shape of a conductive path is other than circle, such as polygon and the like, it is a diameter of a circle assuming a circle equivalent to the area of the section thereof.

Preferable embodiments of respective conductive paths 1 in an anisotropic conductive film of the first embodiment are shown in the following.

Figure 2:
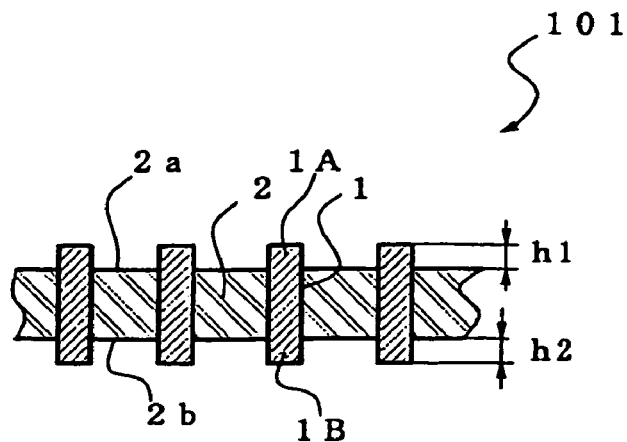
FIG. 2 schematically shows a sectional view of a substantial part of the anisotropic conductive film of the present invention.

Preferably, as an anisotropic conductive film 101 shown in FIG. 2, at least one of the ends 1A, 1B of the conductive path 1 protrudes from the principal plane (2a, 2b) of the film substrate 2. More preferably, the ends 1A, 1B of the conductive path 1 protrude from the both principal planes 2a, 2b of the film substrate 2. In other words, the ends of the conductive path 1 more preferably protrude from both the principal plane on the side opposite to an electronic component and the principal plane on the side opposite to a circuit board. This permits setting of a lower load necessary for a test when an anisotropic conductive film 101 is used as a test connector. The reason therefore is that the conductive path 1 can more easily contact a terminal of a connection target. In addition, an anisotropic conductive film 101 can be easily fixed on a circuit board, thus facilitating a test operation itself.

The protrusion height h1, h2 of the ends 1A, 1B of the conductive path 1 from the both principal planes 2a, 2b of the film substrate 2 is preferably 5–40 μm, more preferably 5–30 μm. It is preferable that the protrusion height of the end of plural conductive paths 1 in one principal plane of the film be the same.

The protrusion height of the end 1A, 1B of the conductive path 1 from one principal plane 2a and the other principal plane 2b of the film substrate 2 may be the same, as shown in FIG. 2, or different. In the latter case, it is preferable to make the protrusion height from the principal plane opposite to an electronic component (semiconductor element etc.) greater than that from the principal plane opposite to a circuit board.

More specifically, the protrusion height of the end of a conductive path from the principal plane opposite to an electronic component is preferably 10–40 μm, more preferably 10–30 μm, and the protrusion height of the end of a conductive path from the principal plane opposite to a circuit board is preferably 5–20 μm, more preferably 5–10 μm, and the difference between the two is preferably 5–35 μm, more preferably 5–20 μm.

When the protrusion height of the end of a conductive path from the principal plane opposite to an electronic component is less than 10 μm, the conductive path 1 is not easily brought into contact with the terminal of a component whose surface is lower than the surface of the component, and when it exceeds 40 μm, the protrusion of the end of a conductive path tends to be deformed during a test. In addition, when the protrusion height of the end of a conductive path from the principal plane opposite to a circuit board is less than 5 μm, the conductive path 1 comes to resist easy contact with a circuit board (circuit) in the repeated use, and when it exceeds 20 μm, a protrusion part of the conductive path tends to be deformed by the repeated use.

Figure 3:
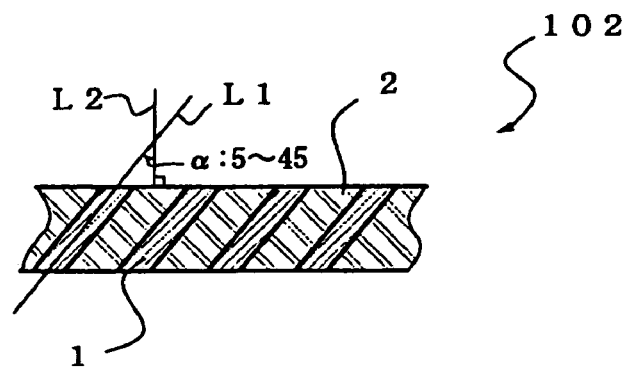
FIG. 3 schematically shows a sectional view of a substantial part of the anisotropic conductive film of the present invention.

Preferably, the centerline of the conductive path 1 penetrates a film substrate 2 while being inclined to form an angle of 5–45° with the vertical line of the principal plane of the film substrate 2. More preferably, the end of the conductive path 1 protrudes from the principal plane of the film substrate 2. This has an effect that a narrow pitched terminal contained in an electronic component, whose surface is lower than the surface of the component, and a conductive path of an anisotropic conductive film can be certainly contacted with a small load. This is described somewhat in detail by referring to FIGS. 3 and 4.

The centerline L1 of plural conductive paths 1 is preferably inclined to form an angle of 5–45° with the vertical line L2 of the principal plane of the film substrate 2. This has an effect that, when a conductive path 1 contacts a terminal, the conductive path 1 bends and the pressure applied to the terminal decreases more.

When the angle (α) that the centerline L1 of the conductive path 1 forms with the vertical line L2 in the principal plane of the film substrate 2 is less than 5°, the contact pressure when the conductive path 1 is brought into contact with the terminal of a connection target (electronic component, circuit board etc.) does not decrease easily, and when it exceeds 45°, the need occurs to adjust (offset) the positions of the end of the conductive path 1 and the terminal of a connection target, which tends to make the handling difficult. The angle α is more preferably 10–40°.

Figure 4:
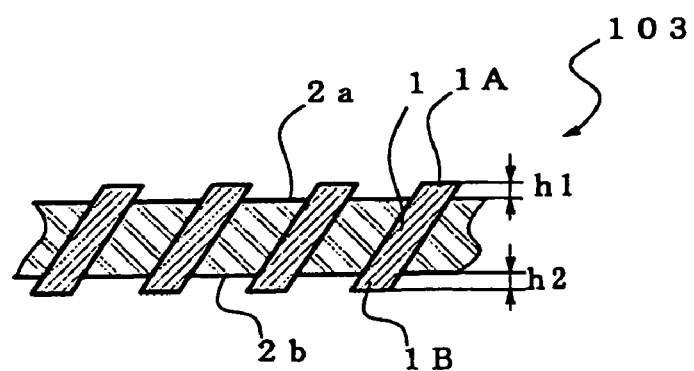
FIG. 4 schematically shows a sectional view of a substantial part of the anisotropic conductive film of the present invention.

More preferably, as shown in FIG. 4, the centerline L1 of the plural conductive paths 1 is inclined to form an angle of 5–45° with the vertical line L2 of the principal plane of the film substrate 2, and the ends 1A, 1B of the conductive paths 1 respectively protrude from the both principal planes 2a, 2b of the film substrate 2.

By employing such constitution, an electronic component and a circuit board can be functionally testably conducted electrically with a low pressure load even when a terminal is disposed at a narrow pitch of not more than 200 μm (further, not more than 100 μm), and a connection target is an electronic component having a surface structure wherein the surface of the terminal is set back from the component surface. As used herein, an electronic component having a surface structure wherein the surface of the terminal is set back from the component surface means an electronic component having a depth from the component surface to the terminal surface is generally about 5–20 μm.

The protrusion height of the ends 1A, 1B of the conductive path 1 from the both principal planes 2a, 2b of the film substrate 2 is preferably set in the range explained in the above. In the same manner as above, it is preferable to set the protrusion height from the principal plane opposite to an electronic component (semiconductor element etc.) greater than the protrusion height from the principal plane opposite to a circuit board, and preferable protrusion heights and the difference in the respective preferable protrusion heights are preferably set within the range explained in the above.

Preferably, an end of the conductive path 1 protruding from the principal plane of the film substrate 2 is covered by plating. As a result, the contact resistance between the conductive path 1 and a terminal of a connection target decreases and corrosion resistance of the conductive path 1 can be improved. The thickness of the coating layer by plating is preferably about 2–10 μm. Such coating layer is preferably formed by plating with a metal having high electric conductivity or a corrosion resistant metal. Preferable examples thereof include a Ni layer/Au layer by electroless plating. By forming a Ni/Au layer by electroless plating, the aforementioned contact resistance can be reduced. The above-mentioned protrusion height of an end of a conductive path from the principal plane of a film substrate when a coating layer by plating is formed on the surface of the end of the conductive path 1 is the height from the principal plane of the film substrate 2 to the surface of the coating layer formed by plating.

As used herein, the terminal (electrode) of an electronic component such as a semiconductor element and the like, which is the target of functional tests, may have various forms, such as a flat pad, one with a solder bump, one having a periphery of a pad covered with a passivation membrane and the like and a surface set back from the surface of the passivation membrane, in other words, one having a terminal (electrode) surface set back from the surface of a component and the like. In addition, the circuit board may be a circuit board as a product to mount an electronic component, or a circuit board as a test tool prepared using the same as a model.

In the first embodiment of the anisotropic conductive film, a known insulating resin material conventionally used for a film substrate of an anisotropic conductive film is used for the film substrate 2. For example, various thermoplastic and thermosetting resins such as thermoplastic polyimide resin, epoxy resin, polyetherimide resin, polyamide resin, silicone resin, phenoxy resin, acrylic resin, polycarbodijmnide resin, fluorine resin, polyester resin, polyurethane resin and the like; thermoplastic elastomers such as polyurethane thermoplastic elastonmer, polyester thermoplastic elastomer, polyamide thermoplastic elastomer and the like; and the like can be mentioned. As used herein, the "insulating resin material" is a concept also including thermoplastic elastomers. The thermoplastic elastomer is a preferable material for enhancing the flexibility of an anisotropic conductive film. These resins and elastomers may contain various materials such as filler, plasticizer and rubber material. Examples of the filler include $SiO_2$ and $Al_2O_3$, examples of the plasticizer include TCP (tricresyl phosphate) and DOP (dioctyl phthalate), examples of the rubber material include NBR (acrylonitrile-butadiene rubber), SBS (polystyrene-polybutylene-polystyrene) and the like.

As mentioned above, the anisotropic conductive film of the first embodiment is preferable as a test connector for an electronic component such as a semiconductor element and the like, and the modulus of elasticity of the structure (anisotropic conductive film) as a whole is preferably 10–30 MPa at 25–40° C., more preferably 10–20 MPa. The modulus of elasticity is measured using a dynamic viscoelasticity measure apparatus (DMS210, Seiko Instruments Inc.). The measurement conditions are an extension mode relative to one direction from among the directions that the surface of the film substrate of the anisotropic conductive film expands at a constant frequency (10 Hz) at a temperature raise rate of 5° C./min and the measurement at −30° C.–250° C. The thickness of the sample to be input for measurement is a thickness of the film substrate in the anisotropic conductive film.

The anisotropic conductive film of this embodiment can be produced by, for example, a method including the following Steps 1–3. The following production method includes cutting a multilayer structure block comprising a layer of wound wire comprising an insulation wire having a coating layer made from an insulating resin formed on an outer periphery of a conductive wire and an insulating resin film, which are alternately laminated, in a given film thickness. Thus, by controlling the thickness of an insulating resin film, the distance between rows of conductive paths of an anisotropic conductive film can be adjusted with good precision. Moreover, an anisotropic conductive film comprising conductive paths arranged in a particular houndstooth check pattern can be efficiently produced.

In a preferable embodiment of the following production method, a multilayer structure comprising a layer of wound wire comprising an insulation wire and an insulating resin film, which are alternately laminated is placed in a space permitting formation of a decompression or vacuum, and after decompressing or vacuumizing the space, the multilayer structure is heated and pressed to give a block of the multilayer structure. In this way, an anisotropic conductive film comprising conductive paths aligned regularly can be obtained.

In another preferable embodiment of the following production method, a block of a multilayer structure is cut into plural blocks, and the plural blocks are integrally connected to give a block having an increased width of a surface where the section of the insulation wire appears, which wide block is then cut to give an anisotropic conductive film. In this way, an anisotropic conductive film comprising having a relatively large area can be efficiently obtained.

Figure 5A:
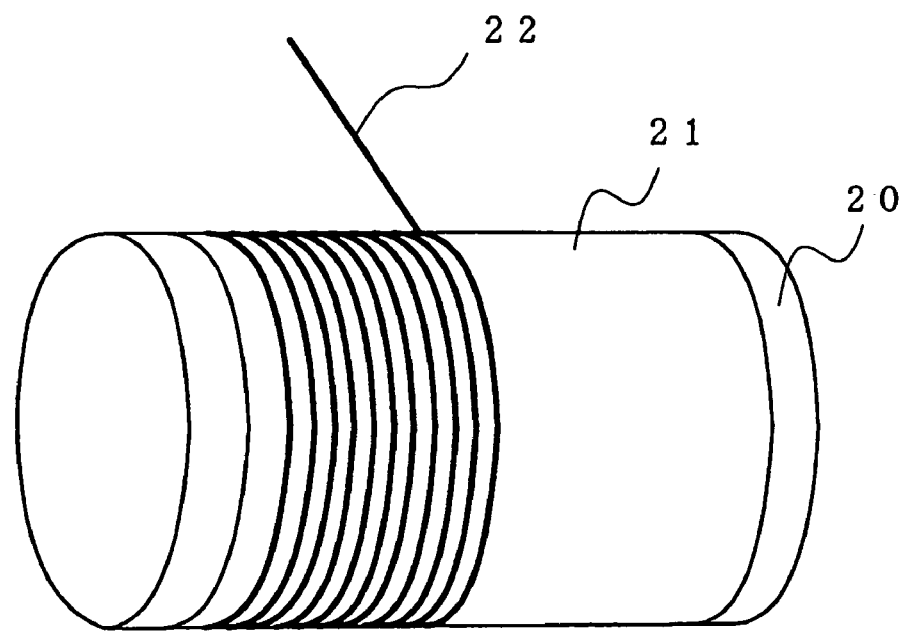
FIG. 5 includes a simplified perspective view (FIG. 5(a)) showing the step of winding an insulating resin film around a core and further winding a conductive wire in Step 1 of the production method of the anisotropic conductive film of the present invention, and a simplified perspective view (FIG. 5(b)) showing the multilayer structure obtained by said step.
Figure 5B:
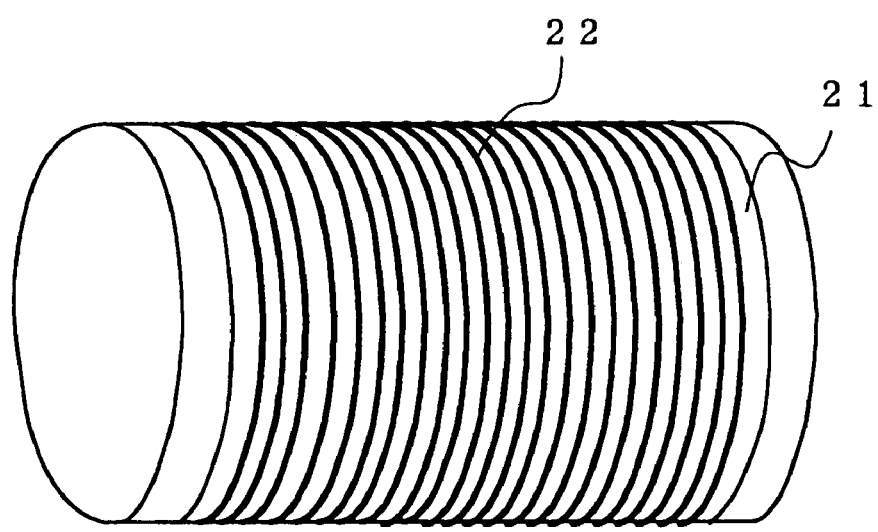

Step 1: As shown in FIG. 5, a sheet of an insulating resin film 21 is wound roll-like around a core 20, and an insulation wire 22 is wound at a given pitch like a coil on the outer periphery of the roll-like insulating resin film 21 (FIGS. 5(*a*), (*b*)), and this step is repeated. The insulation wire 22 comprises a conductive wire 22*a* and a coating layer 22*b* made from an insulating resin, which is formed on the outer periphery thereof. An insulation wire 22 can be wound by, for example, a known winding machine such as a horizontal type regular winding machine and the like. By such repeated operation, a multilayer structure 23 wherein an insulating resin film 21 and a layer of wound wire 22A comprising an insulation wire 22 are alternately laminated can be formed (FIG. 6). FIG. 6 is a sectional view of the multilayer structure 23 along a plane containing the centerline of core 20. As shown in FIG. 6, the middle point M between the centerlines C1 of adjacent insulation wires 22 in the odd-numbered layers of wound wire (22A-1, 22A-3) as counted from the core 20 side, and the centerline C2 of the insulation wire 22 in even-numbered layers of wound wire (22A-2, 22A-4) are aligned on the same straight line (virtual line) L3. To achieve this, the positions of winding insulation wires 22 are dislocated in the longitudinal direction (Z direction in FIG. 6) of core 20 between the odd-numbered layers of wound wire (22A-1, 22A-3) and the even-numbered layers of wound wire (22A-2, 22A-4), as counted from the core 20 side.

Step 2: The multilayer structure 23 obtained in the above-mentioned Step 1 is heated and pressed to melt the insulating resin coating layer 22*b* of the insulation wire 22 and the insulating resin film 21 to give a block of the multilayer structure. While the heating temperature and pressure then vary depending on the materials constituting the insulation wire 22 and insulating resin film 21, the heating temperature is generally about 120–200° C., preferably about 130–180° C. In addition, the pressure is generally about 3–20 $kgf/cm^2$, preferably 5–15 $kgf/cm^2$. Preferably, a multilayer structure 23 is disposed in a space permitting formation of decompression or vacuum, and after decompressing or vacuumizing, multilayer structure 23 is heated and pressed. In this way, a block of a multilayer structure can be formed without leaving an unnecessary gap in the multilayer structure 23, and conductive paths in a finally produced anisotropic conductive film are more regularly aligned. As used herein, the decompression means a pressure smaller than the atmospheric pressure and is generally not more than 0.06 MPa, and vacuum means decompression particularly to the pressure of not more than 0.001 MPa. For efficient removal of the gap, the heating and pressing is more preferably applied in vacuo. While the method for decompression or vacuumization is not particularly limited, suction using a pump (vacuum pump) is preferable for workability.

The above-mentioned space permitting formation of a decompression or vacuum is, for example, the space inside a rigid box (i.e., box having rigidity capable of retaining the shape without deformation when decompressed or vacuumized), the space inside a bag made of a flexible film and the like. The material of the rigid box is, for example, metals such as iron, aluminum, stainless steel, carbon steel, bronze and the like, plastic such as polyethylene, polyurethane, acrylic resin, polyamide, polycarbonate and the like, and the like. As the flexible film, metal films such as aluminum and the like, plastic films such as nylon film, polyester film, polyethylene film, polyimide film and the like or a laminate film wherein an aluminum film and the like are laminated on a polyethylene film and the like, and the like can be used. When a bag made of a flexible film is used and the space inside the bag is vacuumized, the bag closely adheres to the multilayer structure 23, whereby more effectively removing the unnecessary gap in the multilayer structure 23.

In pressing for achieving the heating and pressing, a method including introducing a compressed gas into the above-mentioned space (space permitting formation of a decompression or vacuum) is preferably employed. In the case of the method including introduction of compressed gas, the use of an inert gas such as nitrogen gas and the like as the compressed gas preferably enables suppression of oxidization of the conductive wire.

Step 3: The block of the multilayer structure 23 in the above-mentioned Step 2 is cut into a film of a given thickness. The block is cut along the plane forming an angle with the insulation wire 22 (conductive wire 22a) inside the block of the multilayer structure 23. A tool for cutting may be any as long as it can cut the insulation wire 22 and cut the multilayer structure into a film. For example, a wire saw, a dicer and the like are used.

After performing the Steps 1–3, an anisotropic conductive film having a group of conductive paths in a houndstooth check pattern is obtained. That is, insulation wire 22 (conductive wire 22a) corresponds to the conductive path 1 of an anisotropic conductive film, insulation wires 22 (conductive wires 22a) aligned in one layer of wound wires 2A corresponds to the rows of conductive paths, distance (d1) between the centerlines of aligned insulation wires 22 (conductive wires 22a) corresponds to the distance between conductive paths (D1) inside rows of conductive paths (10A-1, 10A-2, 10A-3, 10A-4 . . . ) in an anisotropic conductive film (see FIG. 1). The distance between conductive paths between adjacent rows of conductive paths (D2) of an anisotropic conductive film is mainly adjusted by the thickness (d2) of the insulating resin film 21. By adjusting the thickness (d2) of the insulating resin film 21 to not more than 0.8 time (preferably not more than 0.7 time) the distance (d1) between centerlines of the above-mentioned insulation wires 22 (conductive wires 22a), the distance between conductive paths between adjacent rows of conductive paths (D2) can be made smaller than the distance between conductive paths within a row of conductive paths (D1) (see FIG. 1). From the aspect of sufficient insulation between conductive paths, the gap between conductive paths is filled with an insulating resin film. Therefore, thickness (d2) og insulating resin films 21 is preferably not less than 0.1 time the distance (d1) between the centerlines of insulation wires 22 (conductive wires 22a). On the other hand, the thickness of the insulating resin coating layer 22b to cover the insulation wire 22 may be such thickness as required for the bond (adhesion) between the insulation wire 22 and the insulating resin film 21, which is generally selected from the range of 1–10 μm.

It is possible to cut out a number of small blocks from the block of multilayer structure 23 in Step 2, stack these small blocks in such a manner that the section of each insulation wire 22 (conductive wire 22a) faces the same direction, heat and press the blocks to integrate them into a block having a greater width, and cut the block having a greater width to give a film having a given thickness with a plane forming an angle with the insulation wire 22 (conductive wire 22a) as a section, whereby an anisotropic conductive film having a relatively large area can be produced. It is preferable to dispose a number of small blocks stuck in a certain direction in a space permitting formation of decompression or vacuum, and after decompressing or vacuumizing the space, heat and press the above-mentioned a number of small blocks. In this way, unnecessary gaps between stuck blocks and unnecessary gaps remaining in a trace amount in each block can be eliminated, and as a result, the conductive paths in an anisotropic conductive film to be finally produced are more regularly aligned. The heating and pressing conditions here are the same as those in Step 2. To prevent position error of stuck blocks, the stuck blocks are preferably placed in a heat resistant box having one open plane, and pressed from the side of the open plane. When the stuck blocks are placed in a bag made of a flexible film, pressed and the inside space is vacuumized, the bag closely adheres to the stuck blocks. As a result, unnecessary gaps inside respective blocks and between blocks can be more effectively removed. As the box and bag, those similar to the box and bag used in Step 2 can be used.

In the above-mentioned production method, when an anisotropic conductive film of a type having an end of a conductive path protruding from the principal plane of a film substrate is to be produced, an anisotropic conductive film obtained through the above-mentioned Steps 1–3 can be subjected to the following treatments.

First, a method comprising protruding an end of a conductive path by selectively removing the film substrate from the principal plane side can be mentioned. To be specific, wet etching with organic solvent, dry etching by plasma etching, argon ion laser, KrF excimer laser and the like are used alone or in combination. Of these, plasma etching is preferable in view of superior control of etching amount, and of the methods of plasma etching, reactive ion etching is particularly preferable. It is also possible to make protrusion by plating and deposition by precipitating of metal on the end (edge face) of the conductive path from which to protrude. When a metal is precipitated, the metal may be the same as or different from the metal constituting the aforementioned conductive path. Preferable examples thereof include Ni layer/Au layer by electroless plating. By forming Ni/Au layer by electroless plating, the contact resistance with the terminal of the connection target (electronic component, circuit board etc.) can be advantageously suppressed to a low level.

In the anisotropic conductive film of the first embodiment, conductive paths are present at relatively high density, and the film has flexibility. Therefore, when functional tests of electronic components such as semiconductor element and the like, wherein terminals (electrodes) are disposed at a narrow pitch, and the terminal surface is set back from the component surface, are performed using this anisotropic conductive film, all terminals (electrodes) of an electronic component and conductive parts of a circuit board can be certainly conducted electrically.

To be specific, when the anisotropic conductive film of the first embodiment is used, functional tests of an electronic component wherein the distance between terminals (electrodes) (width of insulating region between adjacent terminals) is set at a narrow pitch of not more than 200 μm, further not more than 100 μm, and moreover, an electronic component wherein the terminals are disposed at a narrow pitch and the surface of the terminal is set at a position of not less than 10 μm (further not less than 20 μm) deep from the surface of the component, can be performed at a load of not more than 10 MPa, further not more than 5 MPa.

The foregoing particularly concerns the usefulness of the anisotropic conductive film of the first embodiment as a test connector. The anisotropic conductive film of the first embodiment may be used as a mounting connector. In this case, since this anisotropic conductive film has a structure wherein resin areas are uniformly dispersed, it can be adhered to an electronic component and a circuit board, and an electronic component having terminals disposed at a narrow pitch can be adhered onto a circuit board with relatively high adhesion strength while ensuring fine electric connection.

When the anisotropic conductive film of the first embodiment is used as a test connector, it can be applied not only to the functional tests of electronic components such as a semiconductor element and the like, but also to the functional tests of circuit boards such as a liquid crystal panel, EL (electroluminescence) and the like. To be specific, the test operation can be done with a low pressure load for an article (test subject) having terminals and circuit (wiring) patterns, which is in need of a conduction test, by inserting the anisotropic conductive film of the present invention between the article (test subject) and a circuit board for testing.

<Second Embodiment>

In a different preferable embodiment (second embodiment), the anisotropic conductive film 100 of the present invention comprises, as the one described in WO98/07216, a plate film substrate 2 made from an insulating material and the conductive paths 1 penetrating the film substrate 2 in the thickness direction while being insulated from each other. In the second embodiment, the above-mentioned film substrate 2 comprises resin and rubber described in detail in the following. FIG. 7 schematically shows a test of an electronic component using this anisotropic conductive film.

The film substrate 2 comprises an acrylic rubber and a naphthalene skeleton epoxy resin crosslinked with a phenol resin. Each resin is described in detail below. As a result of the action of a phenol resin as a crosslinking agent on a naphthalene skeleton epoxy resin, the film substrate 2 shows heat resistance and the presence of an acrylic rubber allows simultaneous expression of flexibility. A method to obtain such film substrate 2 may be similar to a known film production method. For example, a method comprising adding a naphthalene skeleton epoxy resin, a phenol resin and an acrylic rubber to a suitable solvent and forming the mixture into a film and the like are mentioned.

The total weight of a naphthalene skeleton epoxy resin crosslinked with a phenol resin and an acrylic rubber relative to the total weight of the film substrate 2 is preferably not less than 50%, more preferably 70–90%. As the materials that may be contained other than the above-mentioned resin and rubber in the film substrate 2, for example, a polyurethane resin, a polyorganosiloxane resin and the like are mentioned, which are free of any particular limitation as long as the characteristics of the present invention are not impaired.

From the aspect of the heat resistance of the obtained film substrate, the amount of the phenol resin to be added to 100 parts by weight of the naphthalene skeleton epoxy resin during the production of film substrate 2 is preferably 30–100 parts by weight, more preferably 50–70 parts by weight. To achieve fine contact with the contact point of an electrode and the like, the amount of the acrylic rubber to be added to 100 parts by weight of the naphthalene skeleton epoxy resin during the production of film substrate 2 is preferably 50–500 parts by weight, more preferably 70–250 parts by weight.

The "naphthalene skeleton epoxy resin" means a compound having a naphthalene skeleton and not less than two oxirane rings (epoxy groups) in a molecular structure. The naphthalene skeleton epoxy resin is generally used concurrently with a hardening agent (compound having active hydrogen, such as phenol, amine etc.) to form a three-dimensional network polymer for use. While the proportion of the naphthalene skeleton in the naphthalene skeleton epoxy resin is not particularly limited, it is preferably 30 wt %, more preferably 40–70 wt %, in view of the heat resistance of the obtained film substrate.

The naphthalene skeleton epoxy resin is a well-known resin and its production method is also well known and free of any particular limitation.

The "phenol resin" is obtained by condensation of phenol or a derivative thereof with aldehyde. As phenol or its derivative, phenol, cresol and the like can be mentioned. As aldehyde, formaldehyde, acetaldehyde, propionaldehyde, butyl aldehyde and the like can be mentioned.

The phenol resin is a well-known resin and its production method is also well known and free of any particular limitation.

The "naphthalene skeleton epoxy resin crosslinked with a phenol resin" is a resin having a two- or three-dimensional network structure, which is formed by bonding of a phenol resin to an oxirane ring (epoxy group) of the aforementioned naphthalene skeleton epoxy resin.

The "acrylic rubber" is a synthetic rubber mainly comprising an acrylic acid alkyl ester. As the alkyl ester, methyl ester, ethyl ester, butyl ester and the like can be mentioned.

The acrylic rubber is well known and its production method is also well known and free of any particular limitation.

The film substrate 2 for making the anisotropic conductive film is a plate comprising the aforementioned resin and rubber, whose thickness is not particularly limited. It is preferably about 30 μm–1000 μm, more preferably about 50 μm–500 μm.

As mentioned above, in the anisotropic conductive film of the second embodiment, plural conductive paths 1 made from an electrically conductive material are disposed in the film substrate 2 while being insulated from each other and penetrating the film substrate 2 in the thickness direction. Both ends of each conductive path 1 are exposed on the front and back surfaces of the above-mentioned film substrate 2.

Figure 8A:
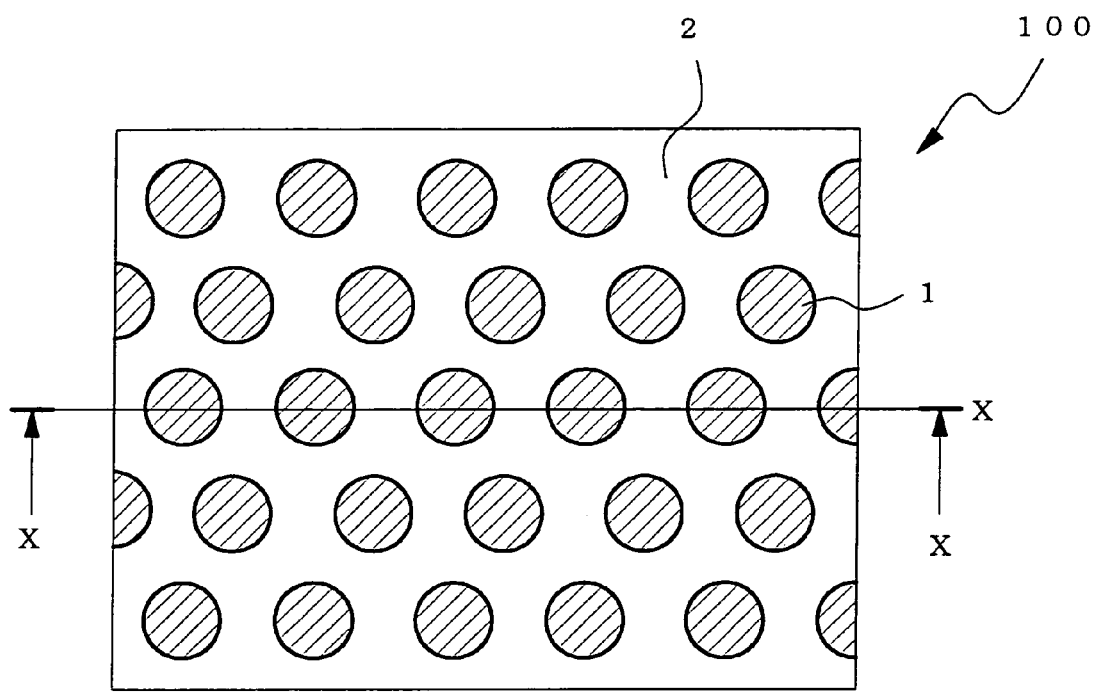
FIG. 8(a) shows an arrangement pattern of conductive paths on one surface of the film substrate, and the sectional view along X—X thereof is shown in FIG. 8(b).
Figure 8B:
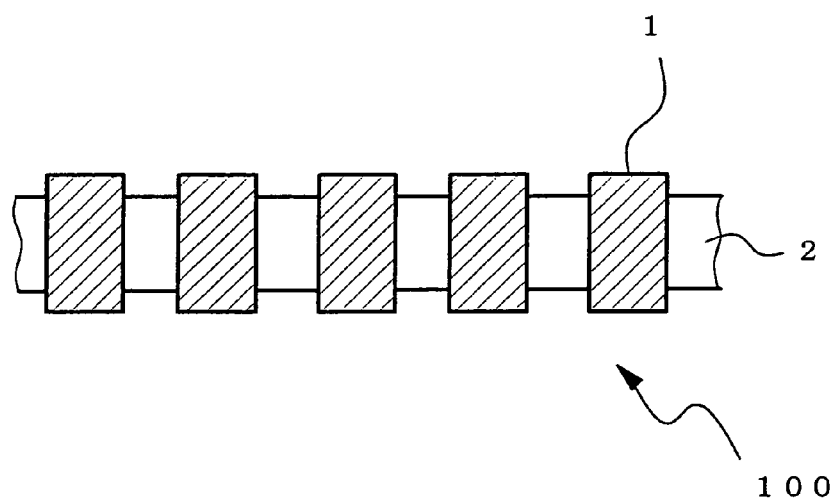
Figure 10:
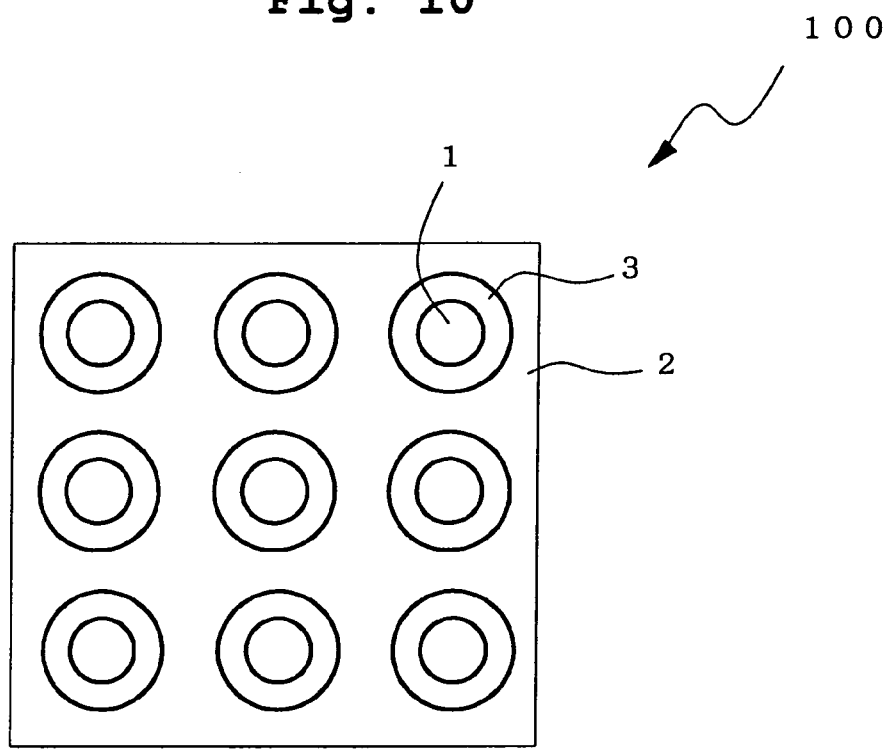
FIG. 10 is a schematic showing of the anisotropic conductive film of the present invention, which shows an arrangement pattern of conductive paths one surface of the film substrate. This Figure shows an enlarged part of the film substrate, like FIG. 8(a), and does not show the entire shape of the outer periphery of the film substrate.

As an embodiment wherein the conductive path 1 penetrates the film substrate 2 in the thickness direction, an embodiment wherein the conductive path penetrates in the same direction with the thickness direction of the film substrate 2 as shown in FIG. 7, an embodiment wherein the conductive path penetrates with inclination from the aforementioned thickness direction (not shown) and the like, or an embodiment wherein the conductive path 1 penetrates while making a curve rather than linearly in the film substrate 2 (not shown). Of these embodiments, in view of the fine contact with an electrode 20a of an electronic component 20 and a circuit pattern 30a of a circuit board 30, which are test subjects, the conductive path 1 is preferably inclined or curved in the film substrate 2. The sectional shape of each conductive path 1 may be any shape, such as a circle, a polygon and the like. It is preferable that the conductive paths 1 be densely disposed so that about 1 to 3 conductive paths 1 will be in contact with an electrode 20a of the test subject electronic component 20. By making plural conductive paths 1 insulated from each other, the presence or absence of electric conduction of an electrode 20a of an electronic component 20 and a circuit pattern 30a of a is circuit board 30 can be independently tested. FIG. 8(a) and FIG. 10 show an arrangement pattern of the conductive paths 1 appearing on one surface of the film substrate 2. FIG. 8(b) is a schematic view of a section along X—X of FIG. 8(a). The arrangement of the conductive paths 1 may be a square matrix as shown in FIG. 10, a close pack as shown in FIG. 8(a) or other randomly packed state. To deal with a minute electrode, a close pack is preferable.

As the materials of the conductive path 1, known electrically conductive materials can be mentioned. From the aspect of electric property, metal materials such as copper, gold, aluminum, nickel and the like are preferable, and from the aspect of electric conductivity, copper and gold are more preferable. From the aspects of electric conductivity, modulus of elasticity and the like, the conductive path 1 may be formed by plating a metal material in a through hole in the film substrate 2, more preferably, an embodiment wherein a metal wire penetrates a film substrate to make a conductive path. Of the metal wires, for example, conductive metal wires such as copper wire defined in JIS 3 3103 and the like, which are produced to transmit electricity are preferable, since they provide conductive path most superior in electrical property, mechanical property and cost. The shape of the section (the section perpendicular to the thickness direction of film substrate 2), size and number of the conductive path 1 can be appropriately determined according to the use of the anisotropic conductive film of the present invention. To deal with a fine pitch electrode arrangement pattern having a pitch of not more than 50 μm, the diameter of the conductive path 1 is preferably 5–60 μm, more preferably 10–60 μm, particularly preferably 10–40 μm. When the section of the conductive path 1 is not circular, the sectional area thereof is preferably about the same area with a circle having the above-mentioned diameter.

Figure 9:
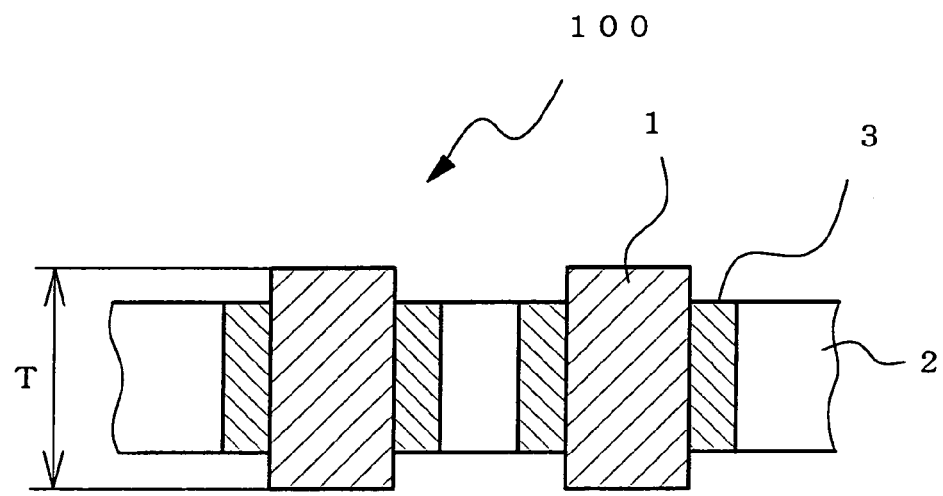
FIG. 9 is a schematic showing of the anisotropic conductive film of the present invention.

Both ends of the conductive path 1 only need to be exposed on the front and back surfaces of the film substrate 2, and in consideration of fine contact with an electrode 20a of an electronic component 20 and a circuit pattern 30a of a circuit board 30, the both ends of the conductive path 1 preferably protrude from the front and back surfaces of the film substrate (see FIG. 9). In this case, the degree of protrusion from the front and back surfaces of the film substrate 2 is preferably about 5–40 μm, more preferably about 5–30 μm. The protrusion from the conductive path 1 may be metal protrusion formed by plating both ends of the conductive path 1 penetrating the film substrate 2, or the conductive metal wire itself penetrating the film substrate 2 may be extended. Particularly, to prevent oxidation of the conductive path 1 penetrating the film substrate 2, oxidation is preferably prevented by plating during forming a protrusion. When the conductive path 1 protrudes from the film substrate 2, the surface of the protrusion may be covered with a metal material having high electric conductivity or a material such as gold, nickel and the like superior in corrosion resistance.

FIG. 9 is a partial schematic view of the anisotropic conductive film of the second embodiment. As shown in this Figure, a layer 3 made from a different material may be formed between the resin material of the film substrate 2 and the conductive path 1. The layer 3 may be superimposed in many layers, and the material may be selected according to use and required properties such as insulation property, electric conductivity and the like. As a material to be used for layer 3 winding the conductive path 1, polyimide resin, polyamide resin, polyester resin, polyurethane resin and the like can be mentioned.

The modulus of elasticity of the anisotropic conductive film as a whole of this embodiment at 20° C.–150° C. is preferably 1–100 MPa, more preferably 10–20 MPa. By setting the modulus of elasticity to not less than 1 MPa, the anisotropic conductive film does not adhere too easily to an electronic component 20 (test subject) and the electronic component 20 can be easily recovered after the test. When the modulus of elasticity is not more than 100 MPa, since swelling of substrate, warp of chip and the like can be easily absorbed by application of a suitable contact load to be mentioned later, defective electric conduction resulting from damage and the like of the conductive path 1 can be reduced.

The modulus of elasticity of the anisotropic conductive film as a whole means the modulus of elasticity of an anisotropic conductive film as a finished product including the film substrate 2 and the conductive path 1, and can be measured by the following tensile test.

measurement apparatus TA Instruments Japan, viscoelasticity measure apparatus RSA-II, test piece 100 μm×5 mm×22.5 mm, measurement conditions The properties at frequency 10 Hz, temperature 20° C., 150° C. in one of the plane expanding directions of a test piece are measured under an extension mode.

While a method of controlling the modulus of elasticity of an anisotropic conductive film is not particularly limited, a method for improving the modulus of elasticity is shown in the following.

To reduce the amount of an acrylic rubber to be added.

To use a material having a small proportion of a naphthalene skeleton in a naphthalene skeleton epoxy resin.

To use an epoxy resin and a phenol resin having plural functional groups in one molecule.

To reduce the modulus of elasticity of an anisotropic conductive film, a method reverse to the above-mentioned can be employed.

The thickness of the anisotropic conductive film of the present invention is preferably 30–1000 μm, more preferably 50–500 μm. When the thickness is not less than 30 μm, a fine contact with an electrode (particularly one with big step) of a test subject can be preferably achieved. When the thickness is not more than 500 μm, transmission loss due to the influence of the length of the electric conduction path can be preferably reduced. The thickness of an anisotropic conductive film means, the maximum length of the distances between two points of the anisotropic conductive film in the direction perpendicular to the plane expanding direction of the film substrate 2. Therefore, when the conductive path 1 does not protrude from the film substrate 2, the thickness of an anisotropic conductive film is the same as the thickness of the film substrate 2 and when the conductive path 1 protrudes from the film substrate 2, the thickness of the anisotropic conductive film is generally the distance between both ends of the conductive paths 1 (length T in FIG. 9).

The anisotropic conductive film of the second embodiment an reduce staining of a metal electrode due to adhesion of low molecular weight components, which occurs when used for the test of an electronic component and the like at 20° C.–150° C.

For producing an anisotropic conductive film 100 of the second embodiment, a method for obtaining a structure wherein the conductive path 1 penetrates the film substrate 2 is not particularly limited. As one example of such methods, as described in WO98/07216, a method comprising fixing a number of insulated conductive wires in a densely packed state to prevent separation from each other, and cutting in a desired film thickness with a plane forming an angle with each insulated electrode as a cutting plane can be mentioned. To be specific, a method comprising the following steps of (1)–(7), or (1)–(5) and (7) can be mentioned.

(1) a step of winding, around a core, a film comprising any of the aforementioned naphthalene skeleton epoxy resin, phenol resin and acrylic rubber as a main component, (2) a step of winding thereon a conductive metal wire having a diameter of 10–60 µm at a given pitch, (3) a step of further winding repeatedly thereon a film, a conductive metal wire, a film, a conductive metal wire, . . . , (4) a step of heating and/or pressing the coil obtained in step (3) and integrally weld-adhering and/or press-adhering the wound films to form a coil block, (5) a step of cutting the coil block obtained in step (4) in a given thickness with the plane forming an angle with the insulated conductive wire as a section to give a film, (6) a step of etching the insulating resin of the film-like product obtained in (5) to protrude a conductive metal wire from the film substrate, (7) a step of further precipitating a metal on an end surface of the conductive metal wire exposed on the film substrate of the film-like product obtained in (5) or (6) for protrusion from the film substrate surface.

Now a test method using the anisotropic conductive film of the second embodiment is explained. The test subject is an electronic component having at least one electrode. Here, by the "electronic component" is meant a component that expresses function by electric conduction and includes semiconductor element, liquid crystal panel, high frequency component and the like. Application of the test method of the present invention to electronic equipment and semiconductor device incorporating an electronic component falls under the application of the test method to electronic components.

This test method is characterized by, as shown in FIG. 7, inserting an anisotropic conductive film 100 of the second embodiment between an electronic component 20 and a circuit board 30 and, while applying a given load, electrically conducting an electronic component 20. According to this method, even if warp, swelling or step is present in an electronic component 20 and a circuit board 30, the anisotropic conductive film 100 deforms to absorb them, whereby an electrode 20a of an electronic component and a corresponding circuit pattern 30a on the circuit board 30 are suitably brought into contact preferably with a minimum load.

As used herein, the "circuit board" may be a circuit board as a product to mount an electronic component 20 or a circuit board produced as a test tool using it as a model.

By insertion of an anisotropic conductive film 100 between an electronic component 20 and a circuit board 30, an electrode 20a of the above-mentioned electronic component 20 and the conductive path 1 of the anisotropic conductive film are brought into contact with each other. It is preferable that the conductive paths 1 be densely disposed so that about 1 to 3 conductive paths 1 will be in contact with an electrode 20a of a test subject electronic component 20.

A load is applied in the direction to press an anisotropic conductive film 100 and an electronic component 20, while inserting, as mentioned above, the anisotropic conductive film 100 between the electronic component 20 and a circuit board 30. A load in such direction is realized by, for example, as shown in FIG. 1, fixing the circuit board 30 on a base (table) and pressing from the electronic component 20 side. The contact load then is preferably 50 g/mm$^2$–5000 g/mm$^2$ per one electrode of an electronic component, and when a circuit board 30 of the test subject is flat, it is particularly preferably 100 g/mm$^2$–3000 g/mm$^2$. This contact load hardly give damage to deform an electrode 20a of an electronic component 20, and is in the range decreasing the contact resistance. That is, when the contact load is less than 50 g/mm$^2$, followability to electrode is difficult to achieve and the connection becomes uncertain (electric conduction rate does not reach 100%), and when it exceeds 5000 g/mm$^2$, electrode 20a of an electronic component 20 is deformed during the test to cause defective connection during mounting. Particularly, when an electronic component has an electrode having a protrusion height of about 20 µm–200 µm, such as a solder bump, a solder ball and the like, the usefulness of the contact load in the above-mentioned range becomes most prominent.

The "contact load per one electrode" means a value obtained by dividing the total load applied to an electronic component 20 by the number of electrodes 20a that have come into contact therewith. Here, the electrode 20a is an electrode contained in an electronic component 20, a test subject. The total load applied on the electronic component 20 can be controlled by, for example, setting of a flip chip bonder.

The load applied while sandwiching an anisotropic conductive film 100 between an electronic component 20 and a circuit board 30 as mentioned above is preferably a load that decreases the thickness of the anisotropic conductive film 100 by 5 µm–150 µm. By performing a functional test of an electronic component 20 in such compressed state, warp and swelling of the electronic component 20 and the circuit board 30 can be efficiently absorbed.

The amount of dislocation (amount of decreased thickness) of the anisotropic conductive film during the test can be directly measured by a micro compression testing machine (Shimadzu Corporation, MCT-W).

A test subject of an electronic component 20 is electrically conducted while applying a load to test the electronic component 20. Here, the test is not particularly limited if it requires electric conduction to an electronic component 20 and may be, for example, confirmation of electric conduction or measurement of contact resistance in electrode 20a.

EXAMPLES

The present invention is explained in detail by referring to examples, which are not to be construed as limitative.

Example 1

An aluminum cylindrical core having a diameter of 320 mm and a length of 270 mm is set on a horizontal type regular winding machine (HPW-02, Nittoku Engineering Co., Ltd.), on which a 50 µm-thick fluorocarbon resin film as a slip film and a film consisting of a 50 µm-thick thermoplastic polyurethane elastomer having a rubber hardness of 75 degrees (Esmer URS, Nihon Matai Co., Ltd., softening temperature 60° C.) were wound, and a heat-resistant polyurethane coated wire (copper wire (diameter 25 µm) coated with heat resistant polyurethane in 2 µm thickness) having a diameter of 29 µm was wound 250 mm at a winding intervals (pitch) of 100 µm. Then, after winding a thermoplastic polyurethane elastomer film similar to the above, winding of heat resistant polyurethane coated wire was further repeated 54 times, during which the odd-numbered layers of wound wires and even-numbered layers of wound wires from the core side were displaced such that the start position of the insulation wire winding was moved by 50 µm in the longitudinal direction of the aluminum cylindrical core. Then, a 50 µm-thick fluorocarbon resin film was wound as a slip film on the outer periphery of a multilayer structure in which the thus-obtained thermoplastic polyurethane elastomer film and a layer of wound wire comprising heat resistant polyurethane coated copper wire are alternately laminated, and a 1 mm thick aluminum plate was set as a support plate along the cylindrical shape of the core.

A bag permitting formation of a vacuum space was prepared from a 80 μm thick heat resistant nylon film (1000 mm×1530 mm, WL 8400-003-60-1000-SHT9, Airtec Co., Ltd., softening temperature: 220° C.) and a seal tape GS213 (Airtec Co., Ltd.), and a multilayer structure, a core and a support plate in integration were placed in this bag. The bag space was hermetically sealed and sucked with a vacuum hose (connected to a vacuum pump) to vacuumize the bag space. While maintaining the vacuum, the bag containing the core, the multilayer structure and the support plate was placed in a heat press treatable autoclave (Ashida Co., Ltd.). After setting, the inside of the tube was heated to make the temperature of the core 155° C. (temperature inside the tube: 200° C.), along with which the tube was pressed with a nitrogen gas to make the pressure inside the tube 10 kgf/cm2. After the core temperature and the pressure in the tube reached the objective levels, the tube was cooled until the temperature inside the tube reached 60° C. and the pressure was released.

Thereafter, the aforementioned bag was taken out of the autoclave and a roll-like block integrated with the multilayer structure in which a thermoplastic urethane elastomer film and a layer of wound wire comprising heat resistant urethane coated copper wire are alternately laminated was taken out of the bag, and the core which had been attached was detached.

Then, the aforementioned roll-like block was cut into plural rectangular blocks of 120 mm in length×62 mm in width×3.2 mm in thickness and after laminating these, the laminated blocks were put in an aluminum box having a size where the gap between the block and the inner wall of the box was 1.5 mm. An aluminum plate (120 mm×62 mm) was placed into the above-mentioned aluminum box from an opening on the upper surface of the box and on the uppermost surface of the aforementioned laminate. In this state, the aluminum box containing the laminate was placed in the bag made of a heat resistant nylon film, which was used in the above. The bag was placed in an autoclave. The aluminum box was heated to a temperature of 175° C. (temperature inside the tube: 200° C.), along with which the tube was pressed with a nitrogen gas, such that the pressure inside thereof became 15 kgf/cm². After the core temperature and the pressure in the tube reached the objective levels, the inside of the tube was cooled to 60° C., and the pressure was released. Then a large size block in which the laminated blocks were integrated was taken out of the box and the block was cut using a wire saw (F-600, Yasunaga Corporation) so that the plane orthogonal to (the centerline of) the conductive wire inside becomes a section, and a film 65 mm in length×120 mm in width×100 μm in thickness was cut out.

The arrangement pattern of the conductive paths in the anisotropic conductive film prepared as above was observed using a stereo microscope, and the intervals (distances) corresponding to D1–D4 in FIG. 1(a) were measured by a microscope. As a result, D1 was 100 μm, D2 was 70 μm, D3 was 107 μm and D4 was 70 μm, respectively. The modulus of elasticity of the entire film at 25–40° C. was 17–20 MPa.

Example 2

Using an APS (Advanced Plasma, Co., Ltd, reactive ion plasma system), the sections (both sides) of the anisotropic conductive film prepared in Example 1 were treated using $CF_4$ as etching gas at a power of 2000 W and a gas flow of 0.5 L/min for 30 min to prepare an anisotropic conductive film in which the end of the conductive path is protruded from both principal planes of the film substrate for 15 μm. The modulus of elasticity of the anisotropic conductive film at 25–40° C. was 16–18 MPa.

Example 3

Using APS (Advanced Plasma, Co., Ltd, reactive ion plasma system), one side of the section of the anisotropic conductive film prepared in Example 1 was treated using $CF_4$ as etching gas at a power of 2000 W and a gas flow of 0.5 L/min for 30 min, so that the end of the conductive path was protruded from the principal plane of the film substrate (principal plane facing the circuit board) for 15 μm, and the other side of the section was treated using $CF_4$ as etching gas at a power of 2000 W and a gas flow of 0.5 L/min for 60 min, so that the end of the conductive path was protruded from the principal plane of the film substrate (principal plane facing the electronic component) for 30 μm, whereby an anisotropic conductive film having a different protrusion amount at the end of the conductive path from each principal plane of the film was prepared. The modulus of elasticity of the anisotropic conductive film at 25–40° C. was 15–17 MPa.

Example 4

The block prepared in the above-mentioned Example 1 was cut using a wire saw (F-600, Yasunaga Corporation), so that the plane crossing at an angle of 75° to (the centerline of) the conductive wire inside becomes a section, and a film of 65 mm in length×120 mm in width×100 μm in thickness in which the centerlines of the plural conductive paths form an angle of 15° to the vertical line of the principal plane of the film substrate was cut out.

The principal plane of the anisotropic conductive film prepared as above was observed by a stereo microscope, and the section of each conductive path (the plane exposed from the principal plane of the film substrate) was an ellipse. With the center thereof being a centerline, the distances between the centerlines corresponding to D1, D2, D3 and D4 in FIG. 1(a) were measured by a microscope to be 100 μm, 70 μm, 107 μm and 70 μm, respectively.

Then, the sections (both sides) of the anisotropic conductive film prepared as above were treated using $CF_4$ as etching gas at a power of 2000 W and a gas flow of 0.5 L/min for 30 min to prepare an anisotropic conductive film in which the end of the conductive path is protruded from both principal planes of the film substrate for 15 μm. The modulus of elasticity of the anisotropic conductive film at 25–40° C. was 16–18 MPa.

Evaluation Test 1

Using the anisotropic conductive film prepared in Example 1, the following connection test (electric conduction test) between the electronic component and the circuit board was carried out.

[Electronic Component for Evaluation]
component size: 3.8 mm in length×3.8 mm in width×2 mm in thickness electrode size: 0.3 mm in length×0.3 mm in width
number of electrodes: 20
arrangement of electrode: peripheral
electrode arrangement distance (pitch): 0.6 mm

[Circuit Board for Evaluation]
substrate: glass epoxy substrate (FR-4)
entire thickness including circuit pattern: 1 mm
ratio of circuit width and interval width of circuit pattern: (0.3 mm:0.3 mm)

[Evaluation Method]
An anisotropic conductive film is disposed between the electronic component for evaluation and the circuit board for evaluation and a contact load is applied from the electronic component side to observe if the electric conduction between all the terminals (electrode) of the electronic component and the circuit board can be achieved (electric conduction at all points).

[Results]
The contact load required for the all point electric conduction was 2.5 MPa.

Evaluation Test 2

Using the anisotropic conductive films prepared in Examples 2–4, the following connection test (electric conduction test) between the electronic component and circuit board was carried out.

[Electronic Component for Evaluation]
component size: 3.8 mm in length×3.8 mm in width×2 mm in thickness
electrode size: 0.3 mm in length×0.3 mm in width
number of electrodes: 20
arrangement of electrode: the electrode surface 20 μm below the component surface
electrode arrangement distance (pitch): 0.6 mm

[Circuit Board for Evaluation]
substrate: glass epoxy substrate (FR-4)
entire thickness including circuit pattern: 1 mm
ratio of circuit width and interval width of circuit pattern: (0.3 mm:0.3 mm)

[Evaluation Method]
An anisotropic conductive film is disposed between the electronic component for evaluation and the circuit board for evaluation and a contact load is applied from the electronic component side to observe if the electric conduction between all the terminals (electrode) of the electronic component and the circuit board can be achieved (electric conduction at all points).

[Results]
The contact load required for the all point electric conduction was 10 MPa when the anisotropic conductive film of Example 2 was used, 8 MPa when the anisotropic conductive film of Example 3 was used and 5 MPa when the anisotropic conductive film of Example 4 was used.

Anisotropic conductive films (Example 5, Comparative Examples 1, 2) were produced according to the steps (1)–(7) above. The materials of the film substrate of each anisotropic conductive film are as described below.

Example 5

The following resin mixture was used.

| | |
|---|---|
| naphthalene type epoxy resin (epoxy equivalent amount 270) | 100 (parts by weight) |
| cresol novolac type epoxy resin (hydroxyl group equivalent amount 174) | 65 (parts by weight) |
| acrylic rubber (epoxy monomer copolymerization crosslinking type) | 170 (parts by weight) |

Comparative Example 1 polyether type polyurethane rubber (Nisshinbo Industries, Inc., MF-50T-MX)

Comparative Example 2 silicone rubber (a commercially available compound containing siloxane as a main component to which a vulcanizing agent is added)

The following anisotropic conductive film was produced using a film substrate made of the above-mentioned materials.

| | |
|---|---|
| film substrate thickness: | 200 μm |
| protrusion length of conductive path from both sides of film substrate: | 20 μm |
| thickness of gold plating on both ends of conductive path: | 0.2 μm |
| entire thickness of anisotropic conductive film: | 240 μm |
| diameter of conductive path: | 25 μm |
| distance (pitch) between centerlines of adjacent conductive paths | 100 μm |

The electronic component (semiconductor element) for the test is as follows.
chip size: 10 mm×10 mm (thickness: 500 μm)
kind of electrode: Au stud bump
bump diameter of electrode: 70 μm
bump height: 70 μm
number of electrodes: 156
pitch between centers of electrodes: 200 μm
Details of circuit board for evaluation are as follows.
glass epoxy substrate: FR-4
thickness including the thickness of circuit pattern: 1 mm
ratio of circuit width and interval width of circuit pattern: 100 μm/100 μm An anisotropic conductive film was disposed between the above-mentioned electronic component and circuit board. By applying a load of 200 g/m² per electrode, electric conduction was carried out to measure and observe the amount of displacement, bump deformation and adhesion to the substrate. The measurement and test were performed for each film at 20° C. and 150° C. The results are shown in Table 1.

TABLE 1

| | Example 5 | | Comp. Ex. 1 | | Comp. Ex. 2 | |
|---|---|---|---|---|---|---|
| Measurement and test temperature (° C.) | 20 | 150 | 20 | 150 | 20 | 150 |

TABLE 1-continued

| | Example 5 | Comp. Ex. 1 | | | Comp. Ex. 2 | |
|---|---|---|---|---|---|---|
| elastic modulus (MPa) | 100 | 20 | 15 | <0.1 | 90 | 80 |
| decrease of thickness (μm) when load was applied | 8 | 12 | 10 | 60 | 10 | 10 |
| Amount of silicone component (mol %) adhered to test object | 0 | 0 | 0 | 0 | 10 | 120 |
| electric connection | OK | OK | OK | NG | OK | OK |
| adhesion to the substrate | no | no | no | yes | no | no |
| evaluation | ○ | ○ | ○ | X | X | X |

In the table, the "amount of silicone component adhered to test subject" means a value obtained by quantifying the silicone component left on the contact face by a SEM-EPMA method after pressing the anisotropic conductive film on copper foil.

The "electric connection" was evaluated as "OK" when electric conduction was confirmed by a compression testing machine and "NG" when not confirmed.

The "adhesion to the substrate" was evaluated as "yes" when, after the test, the anisotropic conductive film cannot come off easily or extraneous matter such as fragments of the film are found even if it comes off, whereas it was evaluated as "no" if the above is not the case.

The film of Comparative Example 1 (using polyurethane rubber) can be used at room temperature (20° C.) but is not a superior anisotropic conductive film in that adhesion to the circuit board is observed at 150° C.

In Comparative Example 2 (using silicone rubber), the low molecular weight component of silicone adheres (be transferred) to the test subject, and therefore the film is not good as an anisotropic conductive film for test.

In contrast, the anisotropic conductive films of Examples have high heat resistance, no weld-adhesion at high temperatures and are free of contamination of test subject due to low molecular weight component, and are a superior anisotropic conductive film which can be used in a wide temperature range.

This application is based on patent application Nos. 2003-317453 and 2003-326810 filed in Japan, the contents of which are hereby incorporated by reference.

What is claimed is:

1. An anisotropic conductive film for testing an electronic component, which comprises a film substrate comprising an insulating resin and plural conductive paths insulated from each other and penetrating the film substrate in a thickness direction, wherein the insulating resin comprises (i) an acrylic rubber and (ii) a naphthalene skeleton epoxy resin crosslinked with a phenol resin, and both ends of the plural conductive paths are exposed on both front and back surfaces of the film substrate.

2. The anisotropic conductive film of claim 1, wherein the plural conductive paths are disposed in a houndstooth check pattern and a distance between conductive paths between adjacent rows of conductive paths is smaller than a distance between conductive paths within a row of conductive paths.

3. The anisotropic conductive film of claim 2,
wherein plural rows of conductive paths in a principal plane of the film are arranged in parallel to each other,
wherein a distance between adjacent rows of conductive paths is smaller than a distance between two adjacent conductive paths within a row of conductive paths in a first direction, and
wherein the distance between adjacent rows of conductive paths is smaller than the distance between two adjacent conductive paths within a row of conductive paths in a second direction perpendicular to the first direction.

4. The anisotropic conductive film of claim 2, wherein the conductive path has an outer diameter of 10–60 μm, the distance between conductive paths within a row of conductive paths is 30–200 μm, and the distance between adjacent rows of conductive paths is not more than ⅘ of the distance between two adjacent conductive paths within a row of conductive paths.

5. The anisotropic conductive film of claim 2, wherein a centerline of the plural conductive paths is inclined to form an angle of 5–45° with a vertical line of a principal plane of the film substrate.

6. The anisotropic conductive film of claim 2, wherein at least one end of the conductive path protrudes from a principal plane of the film substrate.

7. The anisotropic conductive film of claim 6, wherein both ends of the conductive path protrude from both front and back surfaces of the film substrate.

8. The anisotropic conductive film of claim 1, wherein the film as a whole has a modulus of elasticity of 1 MPa–100 MPa at 20° C.–150° C., and the film as a whole has a thickness of 30 μm–1000 μm.

9. The anisotropic conductive film of claim 1, wherein (a) both ends of the conductive paths protrude from the front and the back surfaces of the film substrate, (b) a part of the conductive path, which penetrates the film substrate, is a conductive metal wire having a diameter of 10 μm–60 μm, and (c) the protrusion of the conductive path the conductive metal wire itself extending from the film substrate, or is formed by plating onto the ends of the conductive metal wire.

* * * * *